US009542885B2

(12) United States Patent
Wang et al.

(10) Patent No.: US 9,542,885 B2
(45) Date of Patent: Jan. 10, 2017

(54) PIXEL UNIT, DISPLAY PANEL, DISPLAY METHOD AND DISPLAY DEVICE

(71) Applicant: BOE TECHNOLOGY GROUP CO., LTD., Beijing (CN)

(72) Inventors: Hongli Wang, Beijing (CN); Renwei Guo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/762,200

(22) PCT Filed: Oct. 14, 2014

(86) PCT No.: PCT/CN2014/088557
§ 371 (c)(1),
(2) Date: Jul. 20, 2015

(87) PCT Pub. No.: WO2015/180369
PCT Pub. Date: Dec. 3, 2015

(65) Prior Publication Data
US 2016/0275858 A1    Sep. 22, 2016

(30) Foreign Application Priority Data
May 30, 2014    (CN) .......................... 2014 1 0238598

(51) Int. Cl.
*G09G 3/3225*    (2016.01)
*H01L 27/32*    (2006.01)
(Continued)

(52) U.S. Cl.
CPC ............. *G09G 3/3225* (2013.01); *H01L 27/32* (2013.01); *H01L 27/3211* (2013.01);
(Continued)

(58) Field of Classification Search
CPC .................... G09G 3/3225; G09G 2300/0452; G09G 2300/0465; G09G 2320/0233; G09G 2320/0242; G09G 2340/0457; H01L 27/3211; H01L 27/3213; H01L 27/3218
(Continued)

(56) References Cited

U.S. PATENT DOCUMENTS 6,219,015 B1 *   4/2001   Bloom ................. G02B 5/1828
                                                          345/87
6,892,014 B2 *   5/2005   Cok ........................ G02B 6/06
                                                          345/697
(Continued)

FOREIGN PATENT DOCUMENTS

CN    2705844 Y *   6/2005
CN    2705844 Y     6/2005
(Continued)

OTHER PUBLICATIONS

First Office Action for Corresponding CN Application No. 201410238598.8, dated Oct. 10, 2015, 6 pages.
(Continued)

*Primary Examiner* — King Poon
*Assistant Examiner* — Vincent Peren
(74) *Attorney, Agent, or Firm* — Kinney & Lange, P.A.

(57) ABSTRACT

Embodiments of the present invention disclose a pixel unit made up of three rhombic sub-pixels spliced with each other, and, every two adjacent rhombic sub-pixels of the three rhombic sub-pixels share one common edge and are symmetrical about the common edge. In accordance to embodiments of the present invention, the rhombic sub-pixels have larger sizes and accordingly can be achieved in the existing production line with adoption of the existing mature production technology. Accordingly, high production yield, (Continued)

small spreading difficulty, and wide application prospect can be achieved for products. Meanwhile, embodiments of the present invention also provide a display panel, a display method and a display device.

17 Claims, 17 Drawing Sheets

(51) Int. Cl.
G09G 3/32 (2016.01)
G09G 3/20 (2006.01)

(52) U.S. Cl.
CPC ...... *H01L 27/3213* (2013.01); *H01L 27/3218* (2013.01); *G09G 3/2003* (2013.01); *G09G 2300/0452* (2013.01); *G09G 2300/0465* (2013.01); *G09G 2320/0233* (2013.01); *G09G 2320/0242* (2013.01); *G09G 2340/0457* (2013.01)

(58) Field of Classification Search
USPC .......................................................... 345/428
See application file for complete search history.

(56) References Cited

U.S. PATENT DOCUMENTS

| | | | | |
|---|---|---|---|---|
| 9,231,033 B2* | 1/2016 | Ahn | | H01L 27/3218 |
| 9,412,794 B2* | 8/2016 | Wang | | H01L 27/3218 |
| 2004/0017985 A1* | 1/2004 | Cok | | G02B 6/06 |
| | | | | 385/120 |
| 2005/0253792 A1* | 11/2005 | Shao | | G02F 1/134336 |
| | | | | 345/87 |
| 2007/0070086 A1 | 3/2007 | Elliott et al. | | |
| 2008/0084376 A1* | 4/2008 | Hirota | | G09G 3/3607 |
| | | | | 345/88 |
| 2009/0073099 A1* | 3/2009 | Yeates | | G02F 1/1362 |
| | | | | 345/88 |
| 2013/0135845 A1* | 5/2013 | Matsui | | G09F 13/04 |
| | | | | 362/97.1 |
| 2013/0277645 A1* | 10/2013 | Antonenkov | | H01L 51/0003 |
| | | | | 257/40 |
| 2014/0361965 A1* | 12/2014 | Cheng | | G09G 3/3208 |
| | | | | 345/83 |
| 2015/0021637 A1* | 1/2015 | Ahn | | H01L 27/3218 |
| | | | | 257/89 |
| 2015/0035731 A1* | 2/2015 | Wang | | H01L 27/3218 |
| | | | | 345/76 |
| 2015/0348470 A1* | 12/2015 | Wang | | G02B 5/201 |
| | | | | 345/694 |

FOREIGN PATENT DOCUMENTS

| | | |
|---|---|---|
| CN | 101153930 A | 4/2008 |
| CN | 101286311 A | 10/2008 |
| CN | 101387778 A | 3/2009 |
| CN | 104036700 A | 9/2014 |
| CN | 104330913 A | 2/2015 |

OTHER PUBLICATIONS

International Search Report and Written Opinion dated Mar. 4, 2015 in corresponding PCT Application No. PCT/CN2014/088557.

* cited by examiner

PIXEL UNIT, DISPLAY PANEL, DISPLAY METHOD AND DISPLAY DEVICE

BACKGROUND

Technical Field

The present invention relates to the field of display technologies, and particularly, to a pixel unit, a display panel, a display method and a display device.

Description of the Related Art

In the field of image displaying, R (red) G (green) B (blue) three-color system is a most widely used color appearance system. In this color appearance system, one pixel unit generally includes sub-pixels of three different colors, i.e., red, green and blue. Color and brightness displayed by the pixel unit can be regulated by controlling amounts of RGB three color components corresponding to the three sub-pixels of the pixel unit. FIG. 1A is a schematic view of an arrangement of RGB pixel units of a prior art RGB three-color system. The RGB pixel units are arranged not only in an ordered row but also in respective columns With such arrangement, only one color is arranged in the column direction, which may arise a problem of color unevenness, causing multicolor marginal error and adversely affecting the display effect. FIG. 1B is a schematic view of RGB pixel units, in a delta arrangement, of a prior art RGB three-color system, and, FIG. 1C is a schematic view of RGB pixel units, in a mosaic arrangement, of a prior art RGB three-color system. These two arrangements also cause color unevenness problem in some directions and low resolution ratio.

Since conventional RGB three-color system has low light mixing efficiency and accordingly bad white color rendering property, the existing RGBW four-color system, instead of the conventional RGB three-color system, is adopted gradually. In the existing RGBW four-color system, one pixel unit includes not only a red sub-pixel (R), a green sub-pixel (G) and a blue sub-pixel (B), but also a brightness strengthening sub-pixel (W). Accordingly, it is capable of achieving all the functions of the conventional RGB three-color system and has advantages of high light efficiency and color rendering property.

With the flourish development of the flat panel display technology, Active Matrix Organic Light Emitting Diode (for short, AMOLED) Device becomes a trend of display device due to its excellent characteristics such as lighter and thinner, self-luminescence, high response rate and the like. Organic Light Emitting Diode Device has a stacked structure in which a luminescent layer is located between an anode and a cathode. More and more attentions are paid to full color Organic Light Emitting Diode Device due to high display quality requirement. A full color Organic Light Emitting Diode Device generally achieves a full color display by performing color mixing on sub-pixels made up of red luminescent layer, green luminescent layer and blue luminescent layer. Resolution ratio and contrast are important factors for display quality, however, resolution ratio of the Organic Light Emitting Diode Device is required to be improved due to restrictions of a forming process of the organic layer. Accordingly, there is a need to provide a pixel arrangement which is applicable in the existing technical processes, is lower in cost and has improved resolution ratio.

SUMMARY

According to one aspect of the present invention, there is provided a pixel unit which is formed in a regular hexagonal shape and is made up of three rhombic sub-pixels spliced with each other, and, every two adjacent rhombic sub-pixels of the three rhombic sub-pixels share one common edge and are symmetrical about the common edge.

According to another aspect of the present invention, there is provided a display panel which comprises a plurality of pixel units, wherein, each of the plurality of pixel units is formed in a regular hexagonal shape and is made up of three rhombic sub-pixels spliced with each other, and every two adjacent rhombic sub-pixels of the three rhombic sub-pixels share one common edge and are symmetrical about the common edge; and, wherein, every two adjacent pixel units, except the pixel units at a margin of the display panel, of the plurality of pixel units share one common edge.

According to still another aspect of the present invention, there is provided a display method for the abovementioned display panel, and, the display method comprises: jointing sub-pixels, having one color, of the pixel units adjacent to each other, to form a polygon shape as a sampling area for the corresponding color, such that the sub-pixels having different colors form sampling areas for different colors, respectively; wherein, when one color is to be displayed within its corresponding sampling area, the sub-pixels forming the sampling area are lighted for displaying the color.

According to still yet another aspect of the present invention, there is provided a display device comprises the abovementioned display panel.

BRIEF DESCRIPTION OF THE DRAWINGS

In order to clearly describe technical solutions of the embodiments of the present invention, the drawings used in the embodiments will be introduced briefly hereinafter. Obviously, the technical solutions illustrated in these drawings are only some embodiments of the present invention. For those skilled in the art, other drawings may be achieved by referring to the following drawings without involving any inventive step.

DETAILED DESCRIPTION OF THE EMBODIMENTS

Figure 1A:
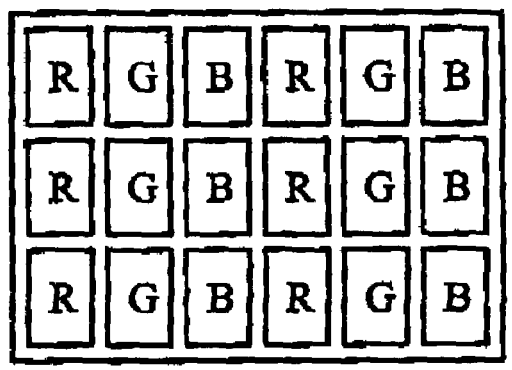
FIG. 1A is a schematic view of RGB pixel units, in a strip arrangement, of a prior art RGB three-color system.
Figure 1B:
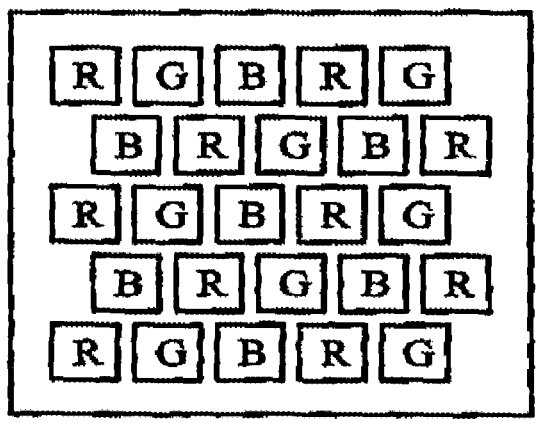
FIG. 1B is a schematic view of RGB pixel units, in a delta arrangement, of a prior art RGB three-color system.
Figure 1C:
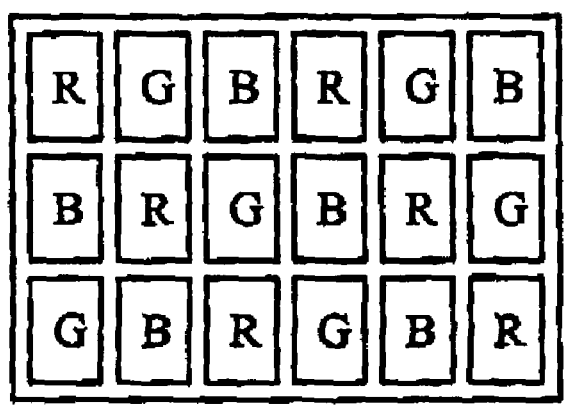
FIG. 1C is a schematic view of RGB pixel units, in a mosaic arrangement, of a prior art RGB three-color system.

Lots of details are presented in the following description in order to provide a complete understanding of the disclosed embodiments. However, obviously, one or more embodiments can be implemented without these details. In other cases, well-known structures and devices are simplified for clear purposes.

In order to provide a more clear understanding of objects, technique solutions and advantages of the present invention, the present invention will be further described hereinafter in detail in conjunction with preferred embodiments and with reference to the attached drawings. It should be noted that, in the attached drawings or the description, the like reference numerals refer to the like elements Implementations that are not shown or described in the attached drawings are well-known knowledge for those skilled in the art. In addition, although parameters used in examples are specific values, these parameters may not be limited to these specific values exactly, but can be correspondingly approximate values within acceptable error tolerance or designated constraint. Orientation terms, e.g., "upper", "lower", "front", "rear", "left", "right", and the likes, mentioned in the embodiments are only for reference in the attached drawings, instead of limiting the scope of the present invention.

Embodiments of the present invention provide a pixel unit. The pixel unit is formed in a regular hexagonal shape, and is made up of three rhombic sub-pixels spliced with each other and each having an obtuse angle of 120°. Every two adjacent rhombic sub-pixels of the three rhombic sub-pixels share one common edge and are symmetrical about the common edge.

The pixel unit may be a RGB pixel unit or a XYW pixel unit. The RGB pixel unit comprises a red rhombic sub-pixel (R), a blue rhombic sub-pixel (B) and a green rhombic sub-pixel (G) spliced with each other. The XYW pixel unit comprises a white rhombic sub-pixel (W) and any two of a red rhombic sub-pixel (R), a blue rhombic sub-pixel (B) and a green rhombic sub-pixel (G), the white rhombic sub-pixel and the any two rhombic sub-pixels being are spliced with each other. Wherein, X and Y indicate any two of the red rhombic sub-pixel (R), the blue rhombic sub-pixel (B) and the green rhombic sub-pixel (G), respectively.

In the pixel units according to an embodiment of the present invention, each pixel unit comprises three rhombic sub-pixels. Since the rhombic sub-pixels have larger sizes and compact arrangement, they can be achieved in the existing production line with adoption of the existing mature production technology.

Embodiments of the present invention also provide a display panel made up of a plurality of the abovementioned pixel units. Along a preset direction of the display panel, the RGB pixel units and the XYW pixel units are arranged alternately, and, the rhombic sub-pixels of the two types of pixel units, whose major axes of rhomb shapes are arranged in the preset direction, are arranged in an end-to-end point contact manner. In the XYW pixel units, white rhombic sub-pixels (W) are arranged such that major axes of rhomb shapes of the white rhombic sub-pixels are arranged along the preset direction. In the RGB pixel units, the rhombic sub-pixels of respective colors are arranged such that their major axes of rhomb shape s are arranged along the preset direction. In addition, every two adjacent pixel units, except the pixel units at a margin of the display panel, share one common edge, and the rhombic sub-pixels, having one color, of each of the pixel units are not adjacent to the rhombic sub-pixels, having the same one color, of adjacent ones of the pixel units. Here, the term "adjacent" indicates the two rhombic sub-pixels share a common edge. Preferably, the preset direction is a column direction or a row direction.

Several embodiments of the display panel of the present inventions are presented in the followings.

First Embodiment

Figure 2:
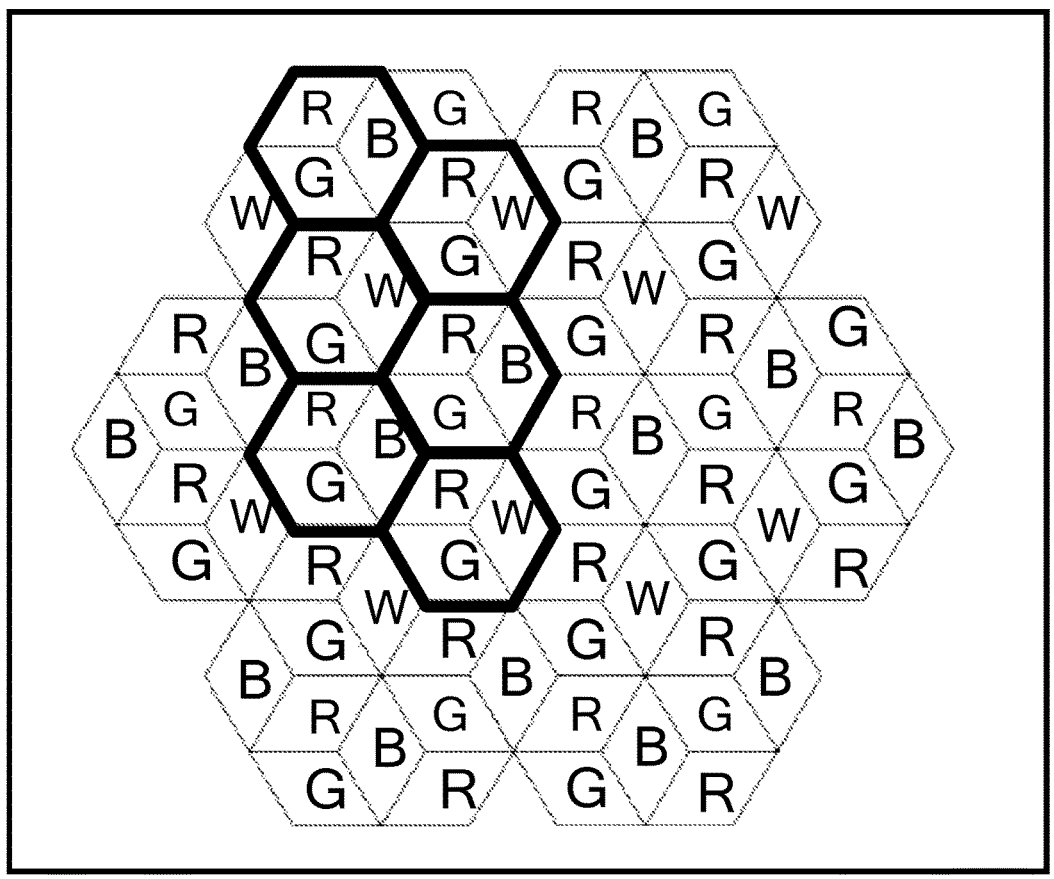
FIG. 2 is a schematic view of arrangement of pixel units in a display panel according to a first embodiment of the present invention.

FIG. 2 is a schematic view of arrangement of pixel units in a display panel according to a first embodiment of the present invention. Referring to FIG. 2, each pixel unit includes one sub-pixel, which has a major axis of rhomb arranged in a column direction and is blue or white in color, and two sub-pixels, which have major axes of rhomb shapes rotated by 120° clockwise and counterclockwise respectively, with respect to the column direction and are red or green in color. With addition of the white rhombic sub-pixels, not only a high brightness is achieved, but also light efficiency is improved, under the premise of enhancement of display resolution ratio.

Calculation will be taken provided that green resin has a transmittance of 60%, red resin has a transmittance of 18% and blue resin has a transmittance of 6%.

In case that three primary colors are arranged in an existing RGB pixel unit and pixels of respective colors have the same pixel area, the RGB pixel unit has a total transmittance of only $\frac{1}{3}*60\%+\frac{1}{3}*18\%+\frac{1}{3}*6\%=28\%$.

In accordance to the embodiment of the present invention, referring to FIG. 2, in each column direction, the RGB pixel units and the RGW pixel units are alternatively arranged. Blue color brings a dimmest visual effect, while addition of the RGW pixel units enhances a displaying brightness and thereby obtains an improved visual effect. Compared with a transmittance of the RGB pixel unit, 28%, the RGW pixel unit has a greatly improved light efficiency, because the white rhombic sub-pixel has a transmittance of 100% and thereby RGW pixel unit has a total transmittance of ⅓*060%+⅓*18%+⅓*100%=59%. With the uniform arrangement of the two kinds of pixel units, whole brightness and uniformity may be enhanced.

In the RGB pixel units and the RGW pixel units, as seen in a direction of columns of the sub-pixels, the red rhombic sub-pixels (R) and the green rhombic sub-pixels (G) may have the same arrangement. However, in the RGW pixel units, the blue rhombic sub-pixels (B) in the RGB pixel units are replaced by white rhombic sub-pixels (W). As shown in FIG. 2, in the above two kinds of pixel units, the red rhombic sub-pixels (R) and the green rhombic sub-pixels (G) are alternatively arranged to form columns of sub-pixels, to which the blue rhombic sub-pixels (B) and the white rhombic sub-pixels (W) are alternatively arranged to form another columns of sub-pixels adjacent.

Second Embodiment

Figure 3:
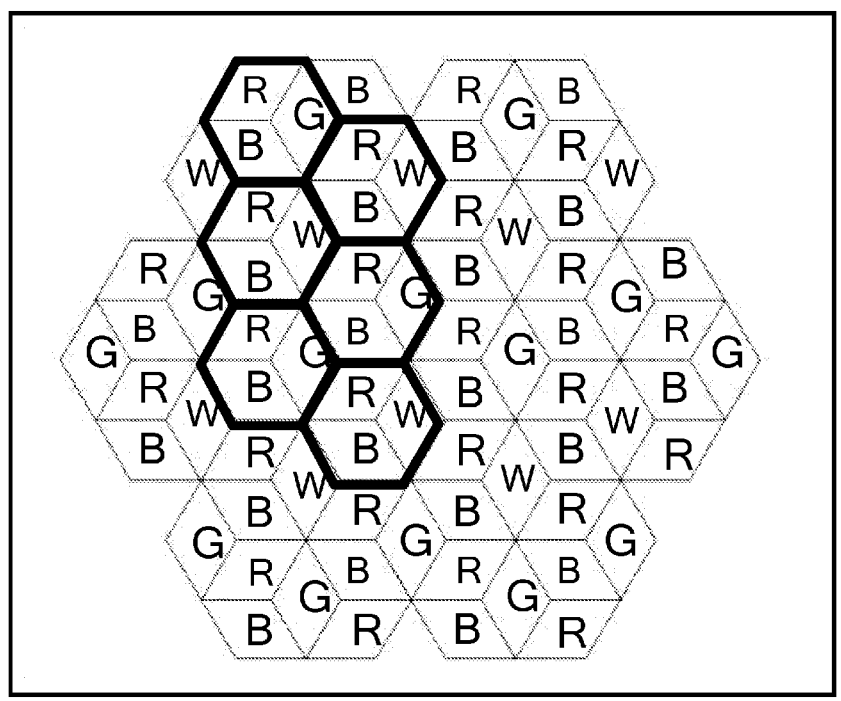
FIG. 3 is a schematic view of arrangement of pixel units in a display panel according to a second embodiment of the present invention.

FIG. 3 is a schematic view of arrangement of pixel units in a display panel according to a second embodiment of the present invention. Referring to FIG. 3, similar to those in the first embodiment, in each column direction, the RGB pixel units and the RBW pixel units are alternatively arranged. In the RGB pixel units and the RBW pixel units, arrangement of the red rhombic sub-pixels (R) is the same as that of the blue rhombic sub-pixels (B). However, in the RBW pixel units, the green rhombic sub-pixels (G) in the RGB pixel units are replaced by white rhombic sub-pixels (W). In the above two kinds of pixel units, the red rhombic sub-pixels (R) and the blue rhombic sub-pixels (B) are alternatively arranged to form columns of sub-pixels, to which the green rhombic sub-pixels (G) and the white rhombic sub-pixels (W) are alternatively arranged to form another columns of sub-pixels adjacent. In other words, in the RGB pixel units, major axes of rhomb shapes of the green rhombic sub-pixels (G) are arranged in the column direction, and major axes of rhomb shapes of the red rhombic sub-pixels (R) and the blue rhombic sub-pixels (B) are rotated by 120° or 60° clockwise and counterclockwise respectively, with respect to the column direction. While, in the RBW pixel units, major axes of rhomb shapes of the white rhombic sub-pixels (W) are arranged in the column direction, and major axes of rhomb shapes of the red rhombic sub-pixels (R) and the blue rhombic sub-pixels (B) are rotated by 120° or 60° clockwise and counterclockwise respectively, with respect to the column direction.

Third Embodiment

Figure 4:
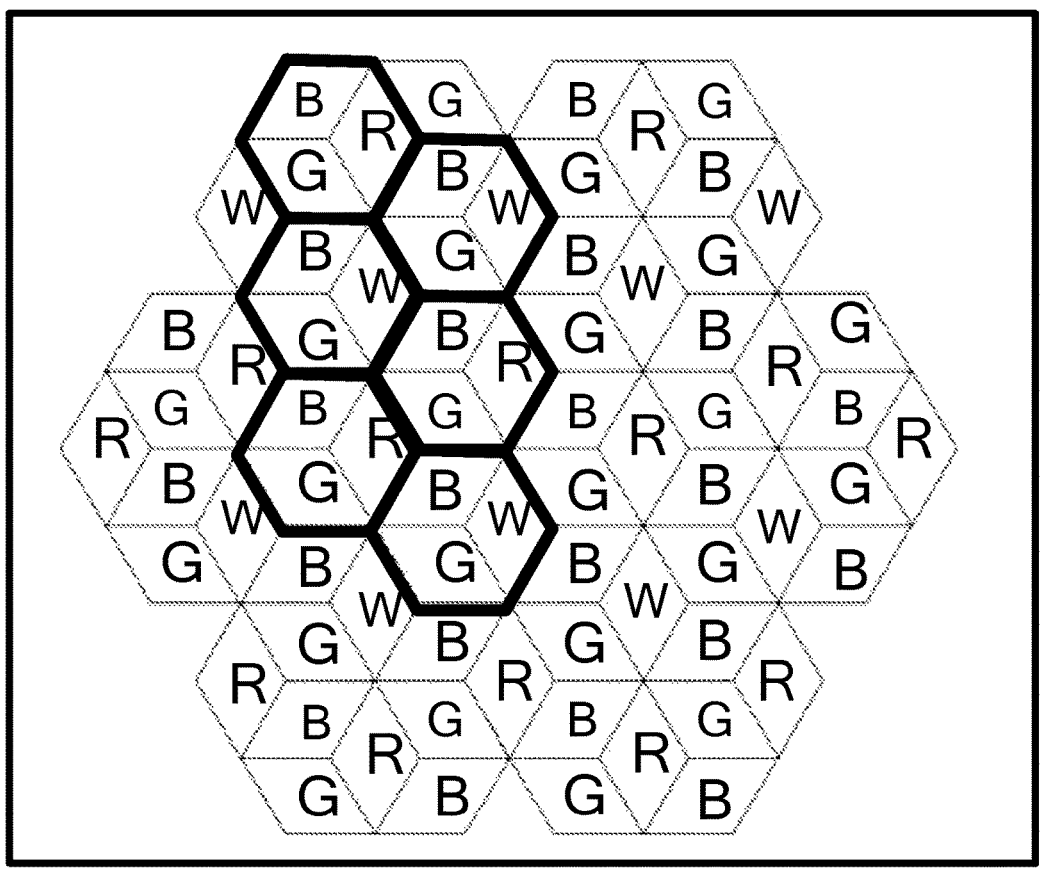
FIG. 4 is a schematic view of arrangement of pixel units in a display panel according to a third embodiment of the present invention.

FIG. 4 is a schematic view of arrangement of pixel units in a display panel according to a third embodiment of the present invention. Referring to FIG. 4, similar to those in the first and second embodiments, in each column direction, the RGB pixel units and the BGW pixel units are alternatively arranged. In the RGB pixel units and the BGW pixel units, arrangement of the blue rhombic sub-pixels (B) is the same as that of the green rhombic sub-pixels (G). However, in the BGW pixel units, the red rhombic sub-pixels (R) in the RGB pixel units are replaced by white rhombic sub-pixels (W). In the above two kinds of pixel units, the blue rhombic sub-pixels (B) and the green rhombic sub-pixels (G) are alter-natively arranged to form columns of sub-pixels, to which the red rhombic sub-pixels (R) and the white rhombic sub-pixels (W) are alternatively arranged to form another columns of sub-pixels adjacent. In other words, in the RGB pixel units, major axes of rhomb shapes of the red rhombic sub-pixels (R) are arranged in the column direction, and major axes of rhomb shapes of the blue rhombic sub-pixels (B) and the green rhombic sub-pixels (G) are respectively rotated by 120° or 60° clockwise and counterclockwise, with respect to the column direction. While, in the BGW pixel units, major axes of rhomb shapes of the white rhombic sub-pixels (W) are arranged in the column direction, and major axes of rhomb shapes of the blue rhombic sub-pixels (B) and the green rhombic sub-pixels (G) are respectively rotated by 120° or 60° clockwise and counterclockwise, with respect to the column direction.

Fourth Embodiment

Figure 5A:
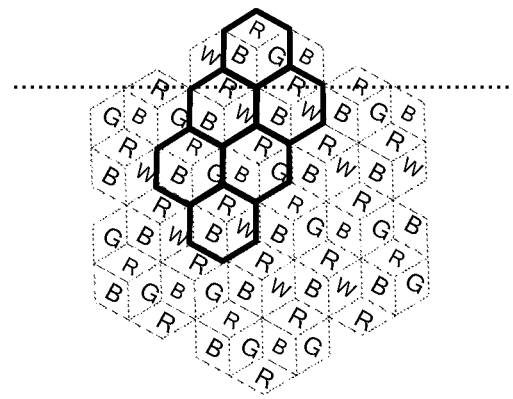
FIGS. 5A-5C are schematic views of arrangement of pixel units in a display panel according to a fourth embodiment of the present invention.
Figure 5B:
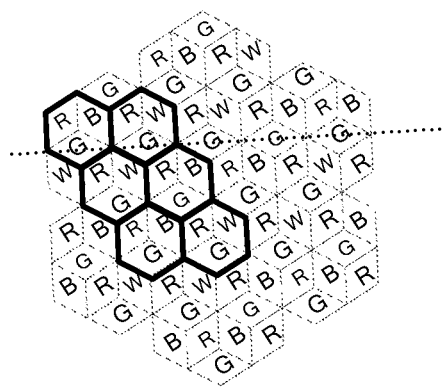
Figure 5C:
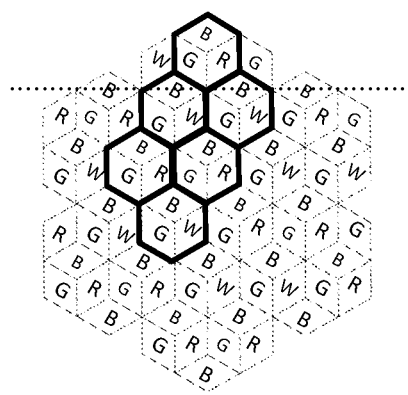

FIGS. 5A-5C are schematic views of arrangement of pixel units in a display panel according to a fourth embodiment of the present invention. Different from those in the first embodiment, in this embodiment, each pixel unit includes one sub-pixel which has a major axis of rhomb arranged in a row direction and two sub-pixels which have major axes of rhomb shapes respectively rotated by 120° clockwise and counterclockwise, with respect to the column direction, as shown in FIGS. 5A-5C. In this embodiment, the sub-pixel which has a major axis of rhomb arranged in the row direction may be a red color pixel (shown in FIG. 5A), a green color pixel (shown in FIG. 5B), or a blue color pixel (shown in FIG. 5C).

It should be noted that, in this embodiment, arrangement of the pixel units may be achieved by rotating the pixel arrangement of the first, second and third embodiments. For example, the pixel arrangement shown in FIG. 5A may be achieved by rotating the pixel arrangement of the first embodiment (shown in FIG. 2) by 60° clockwise, the pixel arrangement shown in FIG. 5B may be achieved by rotating the pixel arrangement of the second embodiment (shown in FIG. 4) by 60° counterclockwise, and, the pixel arrangement shown in FIG. 5C may be achieved by rotating the pixel arrangement of the third embodiment (shown in FIG. 4) by 60° clockwise.

On the basis of the abovementioned display panel, embodiments of the present invention also provide a display method for a display panel. The display panel is the above-mentioned one. The display method comprises: jointing sub-pixels, having one color, of the pixel units adjacent to each other, to form a polygon shape as a sampling area for the corresponding color, such that the sub-pixels having different colors form sampling areas for different colors, respectively; wherein, when one color is to be displayed within its corresponding sampling area, the sub-pixels forming the sampling area are lighted for displaying the color. By using a virtual display technology, this display method achieves display of these color components and multicolor, thereby further improving resolution ratio.

This display method will be explained by taking the arrangement of the pixel units according to the first embodiment as an example. For point display or continuous region display of these color components, there are eight cases as follows.

Figure 6A:
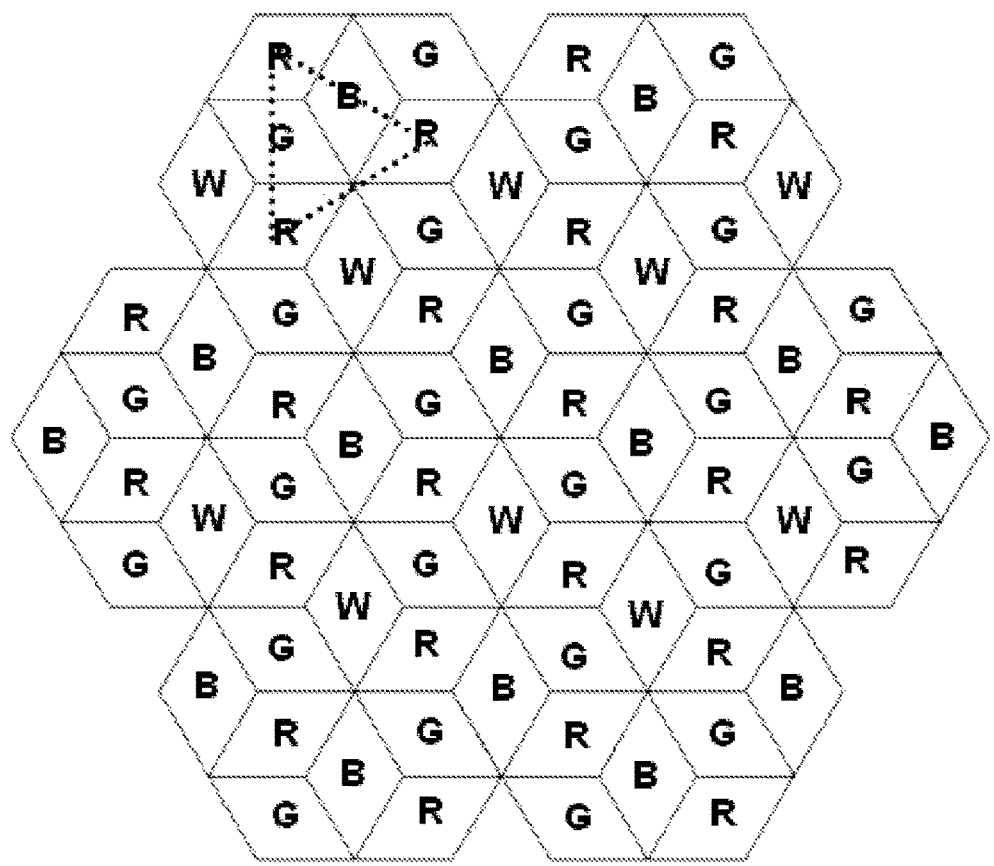
FIGS. 6A and 6B are schematic views of performing a red component output by adopting a triangular sampling area and a rhombic sampling area, respectively, with a display method according to an embodiment of the present invention.

(1) In case that a red component is to be displayed in a preset position of the display panel, referring to FIG. 6A, three adjacent red rhombic sub-pixels, which are arranged around the preset position in a triangular arrangement to constitute a triangular sampling area, are lighted for outputting the red color.

Figure 6B:
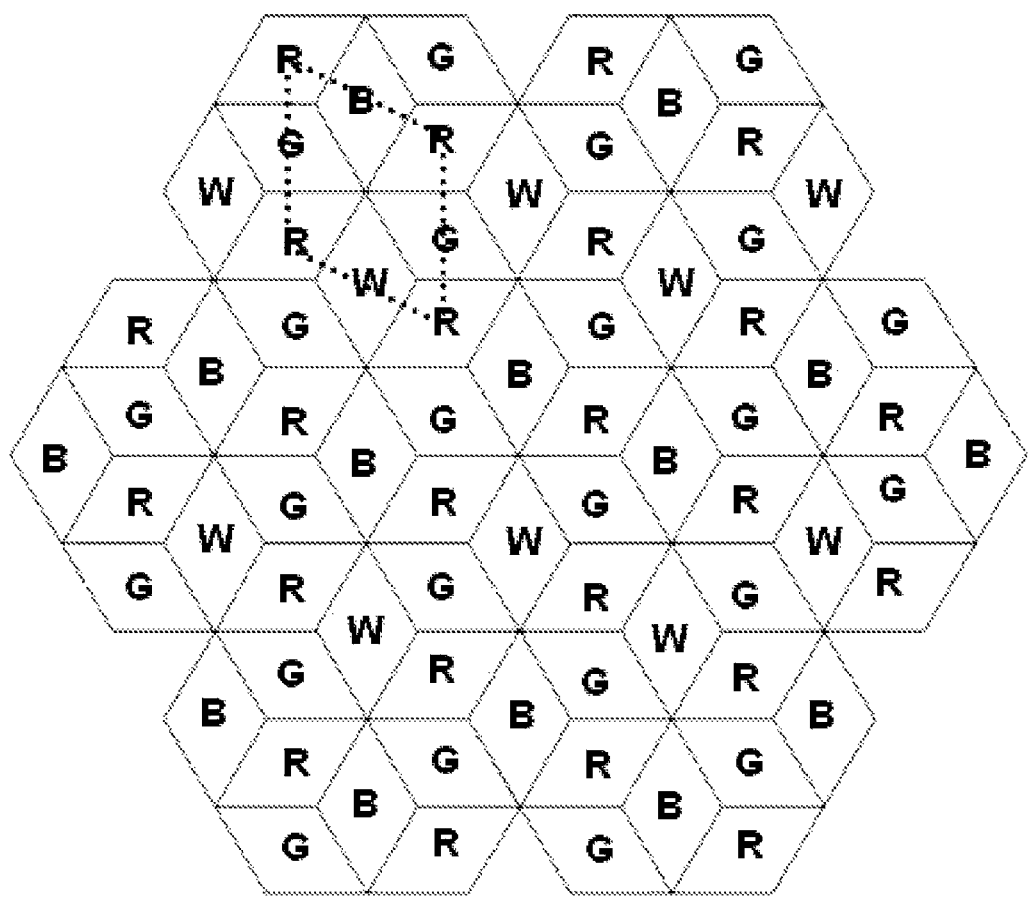

Also, referring to FIG. 6B, four adjacent red rhombic sub-pixels, which are arranged around the preset position in a rhombic arrangement to constitute a rhombic sampling area, are lighted for outputting the red color.

The triangular sampling area is able to display a point accurately, which achieves an improved display effect for image boundaries, while the rhombic sampling area is able to achieve an improved display effect for continuous region and has less amount of calculation for large-sized display, which is more suitable to display a continuous region inside an image.

Figure 7A:
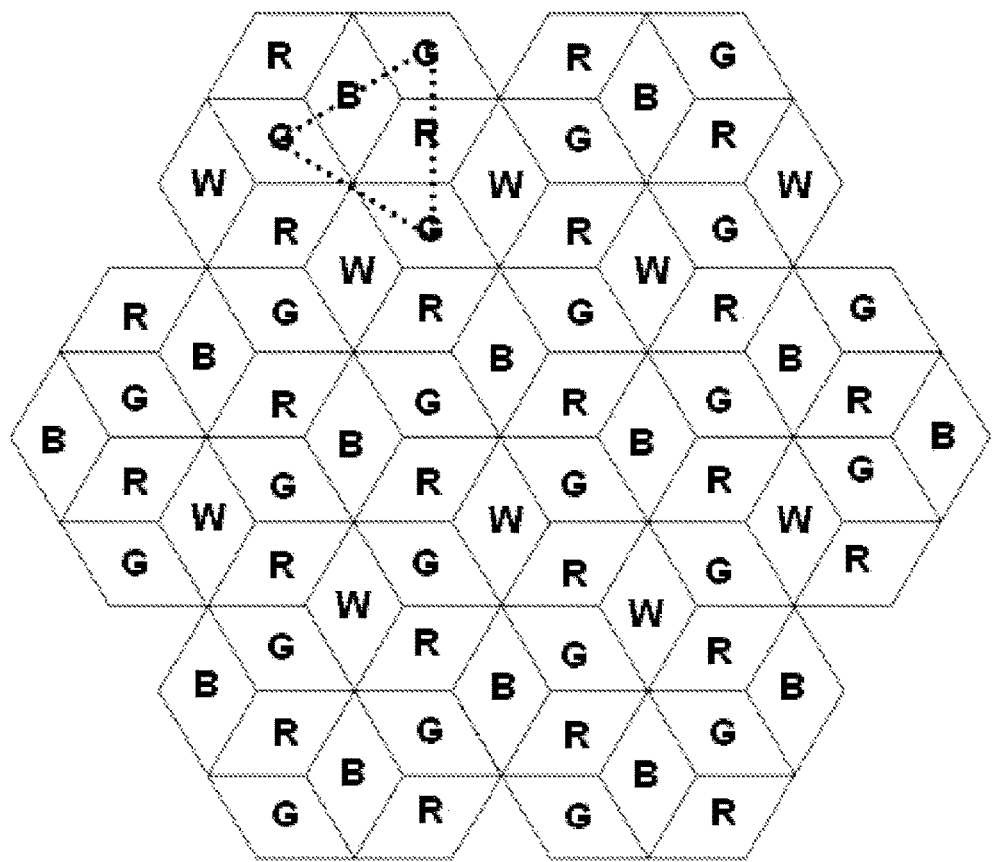
FIGS. 7A and 7B are schematic views of performing a green component output by adopting a triangular sampling area and a rhombic sampling area, respectively, with a display method according to an embodiment of the present invention.

(2) In case that a green component is to be displayed in a preset position of the display panel, referring to FIG. 7A, three adjacent green rhombic sub-pixels, which are arranged around the preset position in a triangular arrangement to constitute a green triangular sampling area, are lighted for outputting the green color.

Figure 7B:
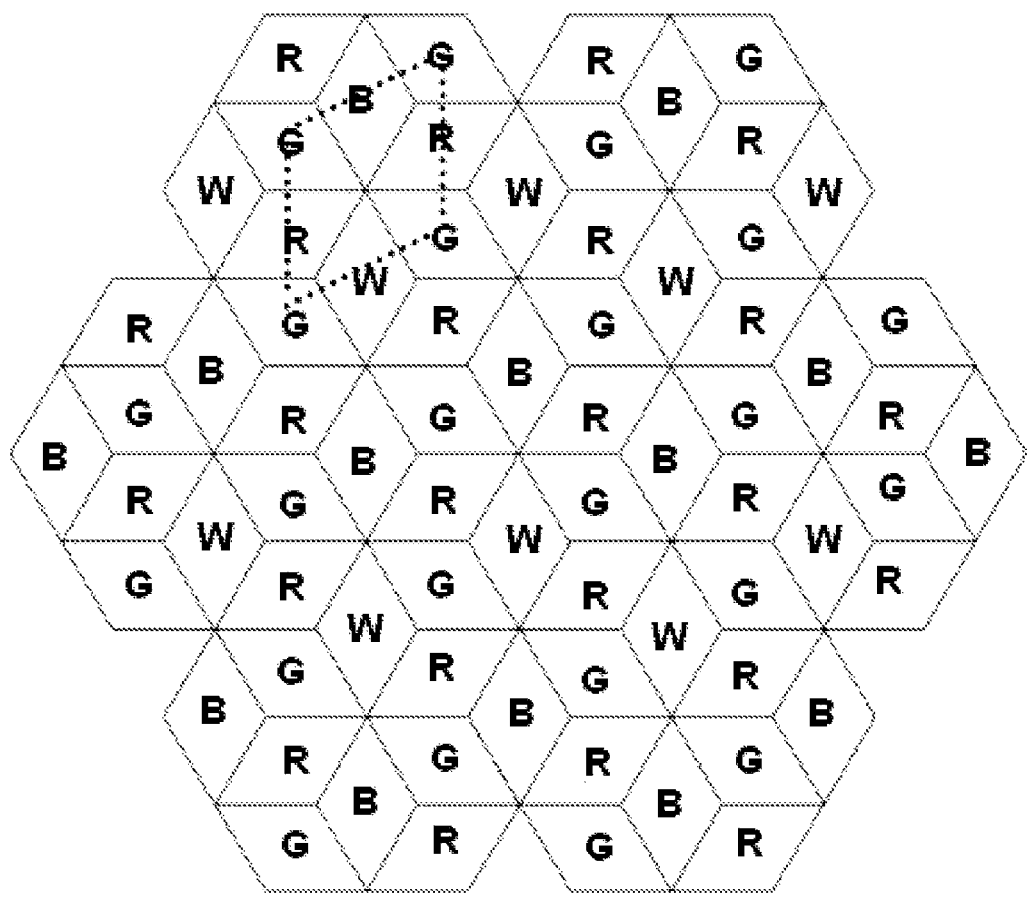

Also, referring to FIG. 7B, four adjacent green rhombic sub-pixels, which are arranged around the preset position in a rhombic arrangement to constitute a green rhombic sampling area, are lighted for outputting the green color.

Figure 8A:
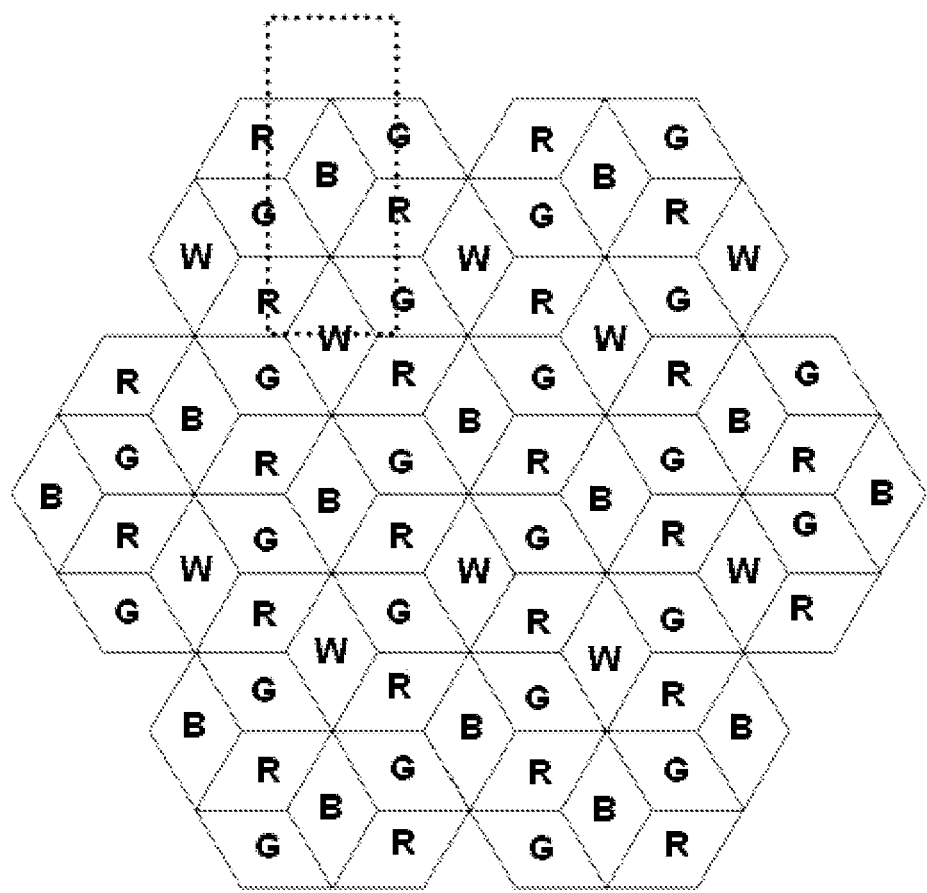
FIG. 8A is a schematic view of performing a blue component output by adopting a rectangular sampling area, with a display method according to an embodiment of the present invention.

(3) In case that a blue component is to be displayed in a preset position of the display panel, referring to FIG. 8A, a rectangular region where at least one blue rhombic sub-pixel is disposed around the preset position to constitute a blue rectangular sampling area, and the blue sub-pixel in the rectangular region is lighted for outputting the blue color.

That is, construction of the blue sampling area is different from constructions of the red and the green sampling areas, because the blue rhombic sub-pixel has a relatively large spatial location and owns a design of greatly large vertex connection region, which do not meet a fine display requirement. Accordingly, the rectangular sampling area is adopted.

Figure 8B:
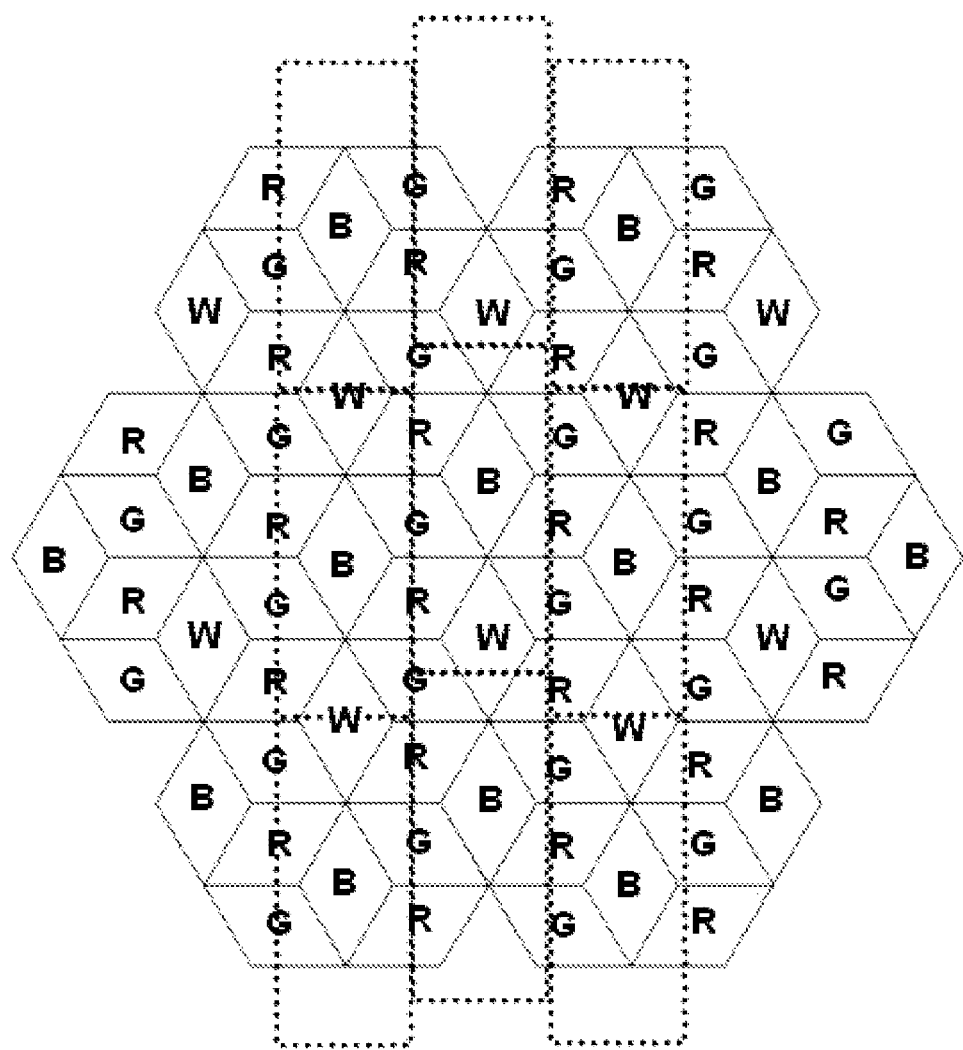
FIG. 8B is a schematic view of performing a blue component output by adopting continuous rectangular sampling areas, with a display method according to an embodiment of the present invention.

In order to display the blue component continuously, by adoption of the abovementioned manner of choosing the rectangular sampling area, a blue display plane is divided into continuous sampling areas each having a rectangular design, as shown in FIG. 8B.

Figure 9A:
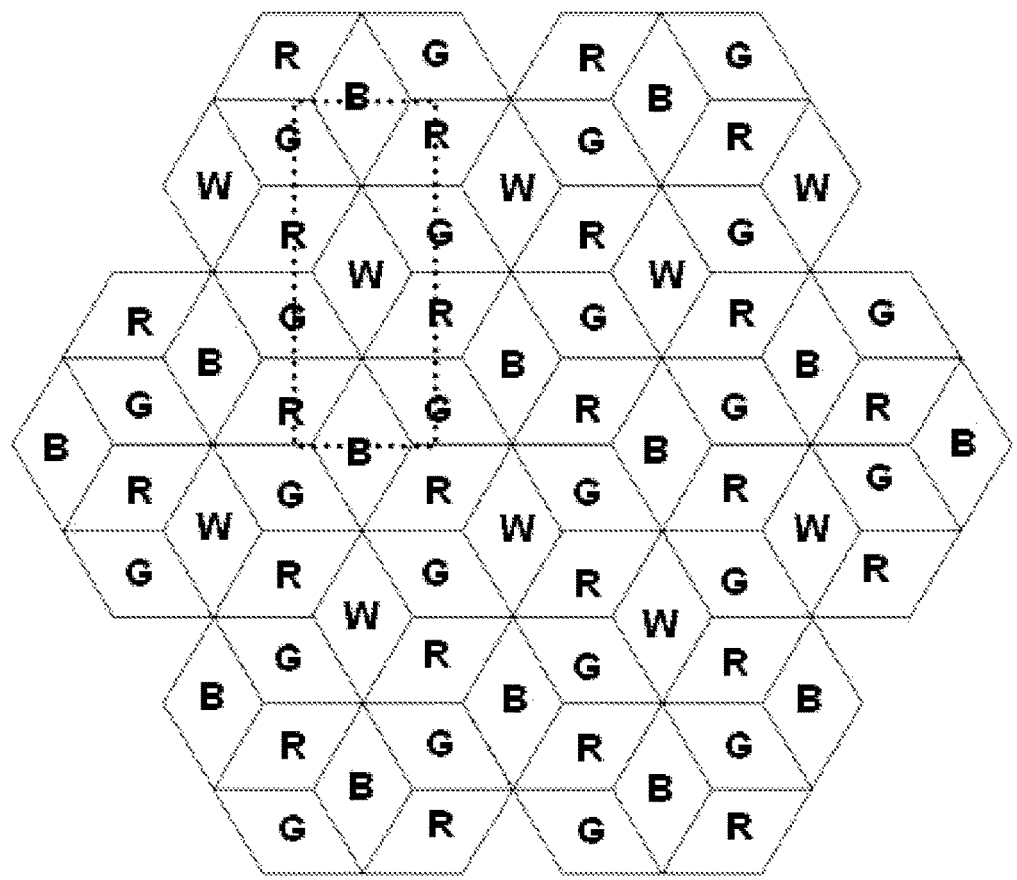
FIG. 9A is a schematic view of performing a white output by adopting a rectangular sampling area, with a display method according to an embodiment of the present invention.

(4) In case that white color is to be displayed in a preset position of the display panel, referring to FIG. 9A, a rectangular region where at least one white rhombic sub-pixel is disposed around the preset position constitutes a rectangular sampling area containing the white rhombic sub-pixel, and the at least one sub-pixel is lighted for increasing a display brightness.

Figure 9B:
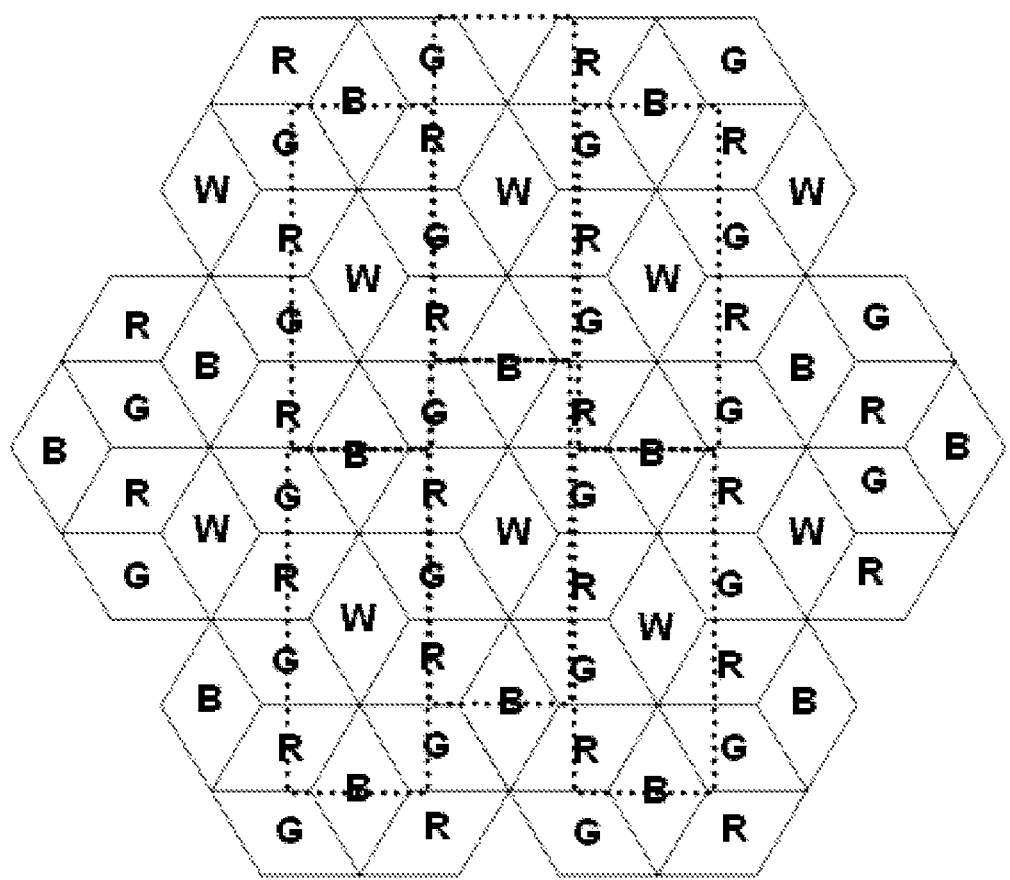
FIG. 9B is a schematic view of performing a continuous white output by adopting continuous rectangular sampling areas, with a display method according to an embodiment of the present invention.

In order to display the white color continuously, by adoption of the abovementioned manner of choosing the rectangular sampling area, a white display plane is divided into continuous sampling areas each having a rectangular design, as shown in FIG. 9B.

Figure 10:
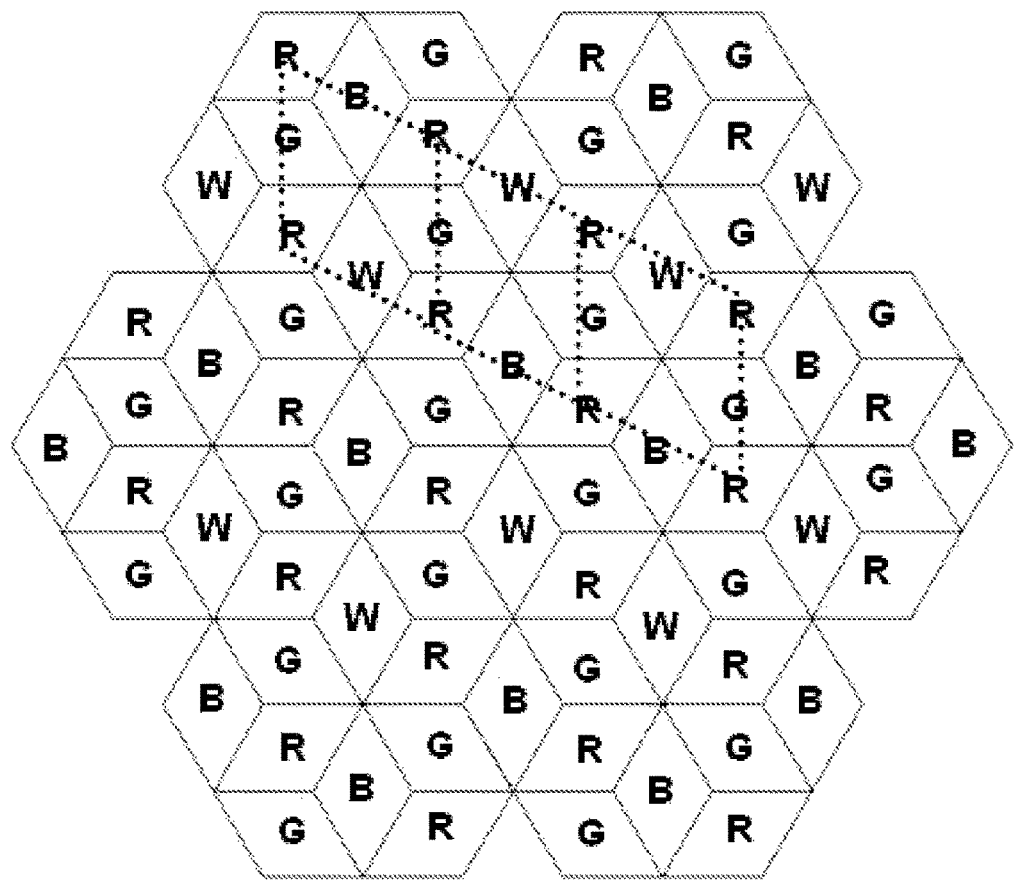
FIG. 10 is a schematic view of performing a continuous red component output by adopting continuous rhombic sampling areas, with a display method according to an embodiment of the present invention.

(5) In order to display the red component continuously, a display plane is divided into continuous sampling areas each having a rhombic shape, as shown in FIG. 10, by rhomb shapes, each of which is formed by connecting centers of the red rhombic sub-pixels. The red rhombic sampling area is shown in FIG. 6B. Of course, it is also possible to divide the display plane into continuous triangular sampling areas, which is not repeatedly described here.

Figure 11:
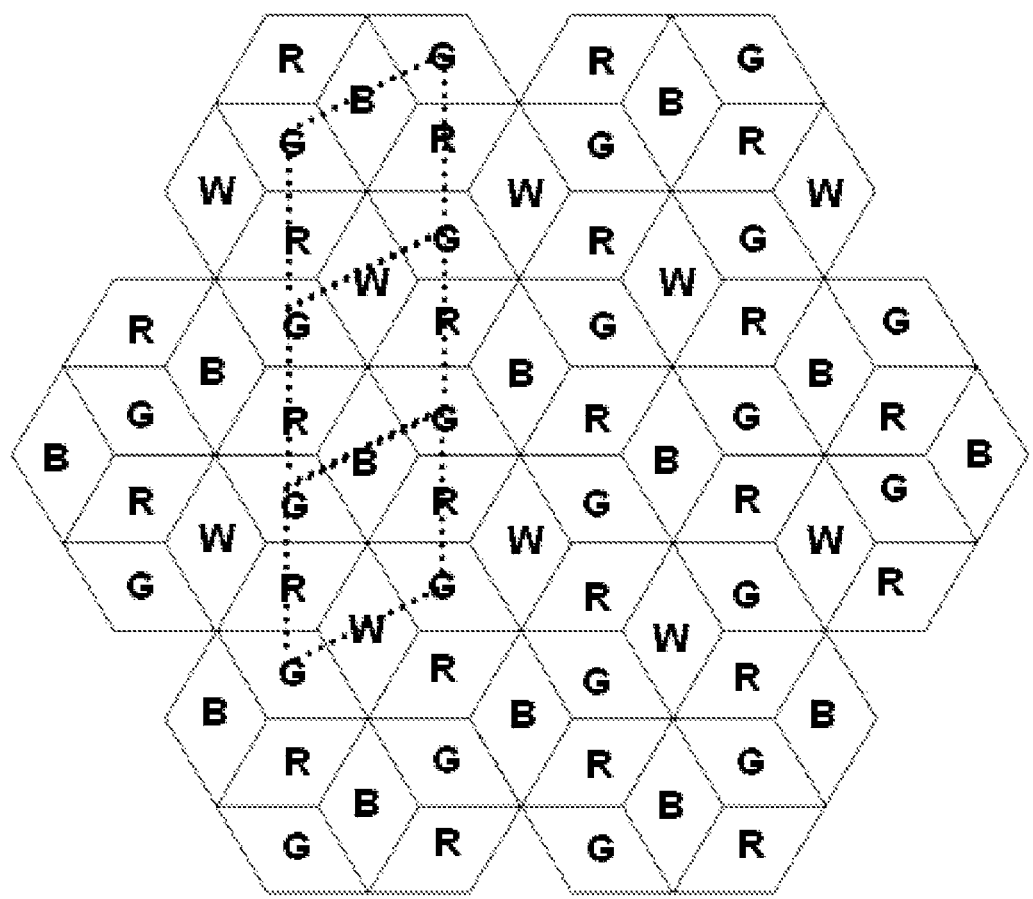
FIG. 11 is a schematic view of performing a continuous green component output by adopting continuous rhombic sampling areas, with a display method according to an embodiment of the present invention.

(6) In order to display the green component continuously, a display plane is divided into continuous sampling areas each having a rhombic shape, as shown in FIG. 11, by rhomb shapes, each of which is formed by connecting centers of the green rhombic sub-pixels. The green sampling area is shown in FIG. 7B. Of course, it is also possible to divide the display plane into continuous triangular sampling areas, which is not repeatedly described here.

Figure 12:
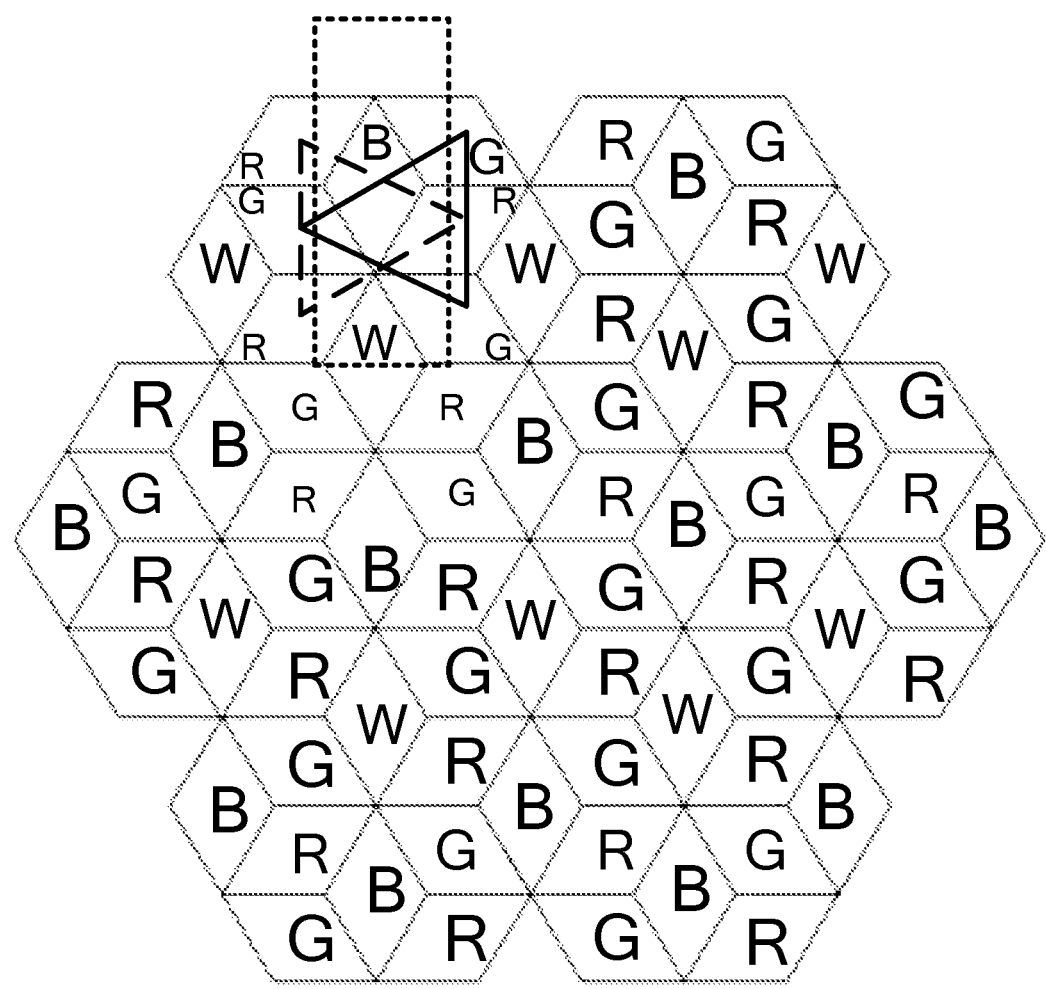
FIG. 12 is a schematic view of design of a sampling area where a multicolor output is performed with a display method according to an embodiment of the present invention.

(7) In case that a multicolor is to be displayed in a preset position of the display panel, referring to FIG. 12, three display areas, i.e., a red display area (as shown by broken line), green display area (as shown by solid line) and a blue display area (as shown by dotted line), are overlapped and stacked with one another. During a display output, the red display area is an output region, the blue and the green display areas each is an output region. At this position, sub-pixels within the respective sampling areas corresponding to these colors will be lighted. Red information is expressed when three sub-pixels within the red sampling area are lighted, green information and blue information are achieved in a similar manner. In case that a yellow color information is to be expressed, the sub-pixels within the red sampling area and the green sampling area are lighted simultaneously, for outputting information. Display of blue information has a similar principle, except different divided regions. With this method, multicolor information may be outputted, and information of higher resolution ratio may be obtained by use of less sub-pixels.

Figure 13:
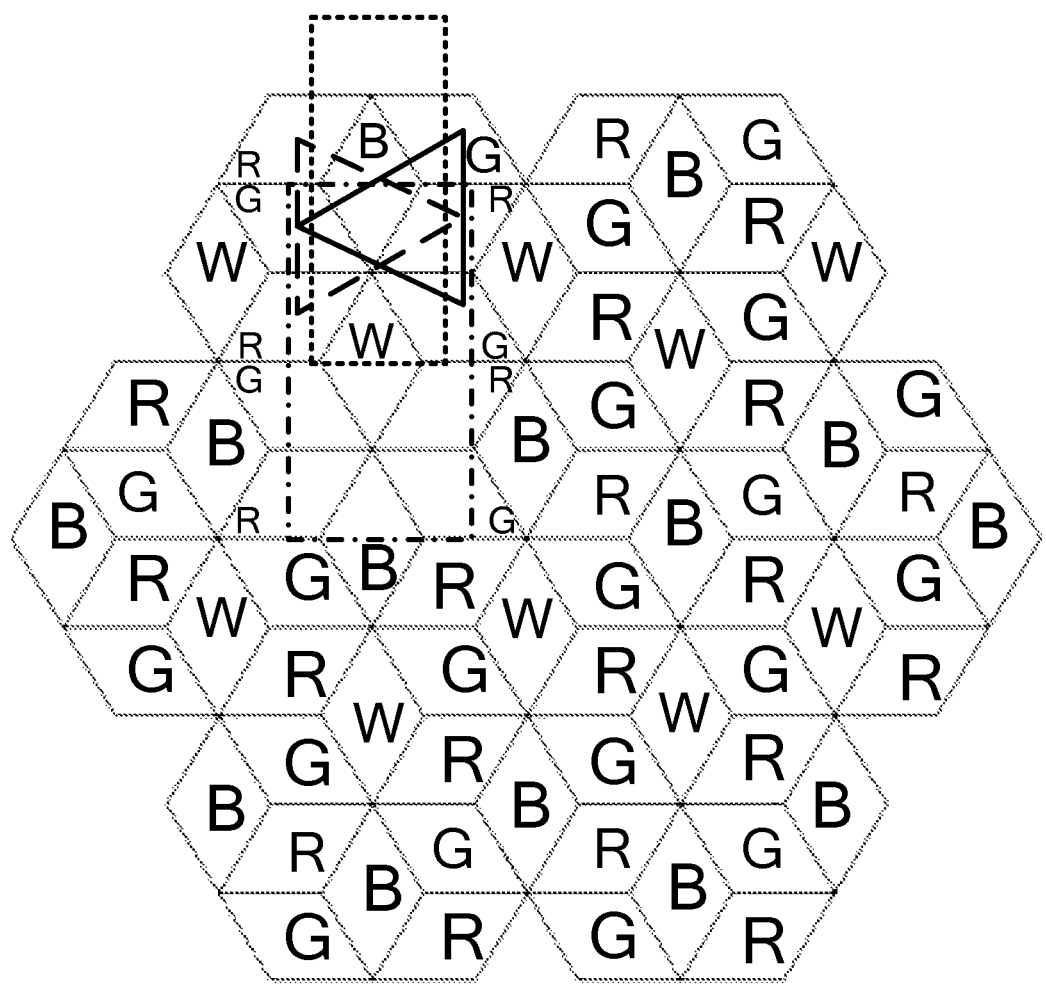
FIG. 13 is a schematic view of design of a sampling area where a multicolor output compensated by white color brightness is performed with a display method according to an embodiment of the present invention.

(8) In case that multicolor display which is compensated by white color brightness is to be displayed in a preset position of the display panel, referring to FIG. 13, white rhombic sub-pixels around the preset position (within a sampling area shown by dash dot line) are lighted, and an average brightness of white sub-pixels within the sampling area is calculated as an output of the white rhombic sub-pixels. As a result, brightness of the dashed region in the figure can be enhanced such that brightness of the whole panel is improved and the energy consumption is reduced.

On the basis of the abovementioned display panel, embodiments of the present invention also provide a display device. The display device comprises a display panel according to abovementioned embodiments. Construction of the display panel has been described in detail and accordingly is omitted here. The display device may be any display device containing the pixel units, e.g., a liquid crystal display device, an organic light emitting display device, a plasma display device, or the like. The display device may also be any electronic equipment containing the display panel, e.g., a digit camera, a mobile phone, a tablet PC, a notebook PC, etc., and there is no particular limitation on this.

So far, these embodiments of the present invention have been described in conjunction with the attached drawings. With the above description, those skilled in the art may have a clear understanding on the pixel unit and the display panel applied with the pixel unit, the display method and the display device according to the present invention.

In addition, definitions of these elements and method steps described above are not limited to specific constructions, shapes and manners mentioned in these embodiments, any changes or alternatives can be made simply by those skilled in the art. For example, for the arrangement of the pixel units shown in FIG. 2, FIG. 3 and FIG. 4, the display panel may be manufactured by performing rotations at any angles clockwise or counterclockwise, but not be limited to rotation at 60° or 90° shown in FIGS. 5A-5C, as long as the major axes of the sub-pixels having the same color are arranged along the row direction. Those skilled in the art may easily achieve a transformed pixel unit arrangement after the rotation, which accordingly is omitted here.

Concerning the above, in the pixel unit, the display panel, the display method and the display device according to embodiments of the present invention, one pixel unit comprises three rhombic sub-pixels, and these rhombic sub-pixels have larger sizes and accordingly can be achieved in the existing production line with adoption of the existing mature production technology. Accordingly, it has high production yield, small spreading difficulty, and wide application prospect, and it can be applied in many fields including mobile screens, flat computer screens, notebook computer screens and PC computer screens, etc. Moreover, in the display method according to embodiments of the present invention, with the abovementioned pixel arrangement manners and displaying modes, and by adopting virtual displaying manners, resolution ratio and enhance display effect can be further improved.

A further description of objects, technique solutions and advantages of the present invention has been provided in conjunction with abovementioned embodiments. It should be understood that the above description is merely used to illustrate specific embodiments of the present invention, but not to limit the present invention. All of changes, equivalent alternatives, improvements, made within principles and spirit of the invention, should be included within the scope of the present invention.

What is claimed is:

1. A display panel, wherein the display panel comprises a plurality of pixel units wherein, each of the plurality of pixel units is formed in a regular hexagonal shape and is made up of three rhombic sub-pixels spliced with each other, and every two adjacent rhombic sub-pixels of the three rhombic sub-pixels share one common edge and are symmetrical about the common edge; and wherein, every two adjacent pixel units, except the pixel units at a margin of the display panel, of the plurality of pixel units share one common edge;
wherein, the display panel comprises two types of pixel units comprising RGB pixel units and XYW pixel units;
wherein, in each of the RGB pixel units, the three rhombic sub-pixels comprise a red rhombic sub-pixel (R), a blue rhombic sub-pixel (B) and a green rhombic sub-pixel (G); and in each of the XYW pixel units, the three rhombic sub-pixels comprises a white rhombic sub-pixel (W) and any two of a red rhombic sub-pixel (R), a blue rhombic sub-pixel (B) and a green rhombic sub-pixel (G); and
wherein, the RGB pixel units and the XYW pixel units are arranged alternately in a preset direction, and, the rhombic sub-pixels of the two types of pixel units, major axes of rhomb shapes of which are arranged in the preset direction, are arranged in an end-to-end point contact manner.

2. The display panel of claim 1, wherein each of the XYW pixel units comprises an RGW pixel unit, an RBW pixel unit or a BGW pixel unit; wherein,
in the RGW pixel unit, the three rhombic sub-pixels comprise a red rhombic sub-pixel (R), a green rhombic sub-pixel (G) and a white rhombic sub-pixel (W);
in the RBW pixel unit, the three rhombic sub-pixels comprise a red rhombic sub-pixel (R), a blue rhombic sub-pixel (B) and a white rhombic sub-pixel (W); and
in the BGW pixel unit, the three rhombic sub-pixels comprise a blue rhombic sub-pixel (B), a green rhombic sub-pixel (G) and a white rhombic sub-pixel (W).

3. The display panel of claim 2, wherein,
in the XYW pixel units, white rhombic sub-pixels (W) are arranged such that their major axes of rhomb shapes are arranged in the preset direction;
in the RGB pixel units, any one of the red rhombic sub-pixels (R), the blue rhombic sub-pixels (B) and the green rhombic sub-pixels (G) is arranged such that its major axis of rhomb shape is arranged in the preset direction; and
in the display panel, the rhombic sub-pixels, having one color, of each of the pixel units are not arranged adjacent to the rhombic sub-pixels, having the same color, of their adjacent ones of the pixel units; and
the preset direction is a column direction or a row direction.

4. The display panel of claim 1, wherein the display panel comprises the RGB pixel units and the RGW pixel units arranged adjacent to each other, and the preset direction is the column direction; wherein,
in the RGB pixel units, the major axes of rhomb shapes of the blue rhombic sub-pixels (B) are arranged in the column direction, while the major axes of rhomb shapes of the red rhombic sub-pixels (R) and the major axes of rhomb shapes of the green rhombic sub-pixels (G) are respectively rotated by 120° or 60° clockwise and counterclockwise, with respect to the column direction; and
in the RGW pixel units, the major axes of rhomb shapes of the white rhombic sub-pixels (W) are arranged in the column direction, while the major axes of rhomb shapes of the red rhombic sub-pixels (R) and the major axes of rhomb shapes of the green rhombic sub-pixels (G) are respectively rotated by 120° or 60° clockwise and counterclockwise, with respect to the column direction.

5. The display panel of claim 1, wherein the display panel comprises the RGB pixel units and the RBW pixel units arranged adjacent to each other, and the preset direction is the column direction; wherein,
in the RGB pixel units, the major axes of rhomb shapes of the green rhombic sub-pixels (G) are arranged in the column direction, while the major axes of rhomb shapes of the red rhombic sub-pixels (R) and the major axes of rhomb shapes of the blue rhombic sub-pixels (B) are respectively rotated by 120° or 60° clockwise and counterclockwise, with respect to the column direction; and
in the RBW pixel units, the major axes of rhomb shapes of the white rhombic sub-pixels (W) are arranged in the column direction, while the major axes of rhomb shapes of the red rhombic sub-pixels (R) and the major axes of rhomb shapes of the blue rhombic sub-pixels (B) are respectively rotated by 120° or 60° clockwise and counterclockwise, with respect to the column direction.

6. The display panel of claim 1, wherein the display panel comprises the RGB pixel units and the BGW pixel units arranged adjacent to each other, and the preset direction is the column direction; wherein,
in the RGB pixel units, the major axes of rhomb shapes of the red rhombic sub-pixels (R) are arranged in the column direction, while the major axes of rhomb shapes of the blue rhombic sub-pixels (B) and the major axes of rhomb shapes of the green rhombic sub-pixels (G) are respectively rotated by 120° or 60° clockwise and counterclockwise, with respect to the column direction; and
in the BGW pixel units, the major axes of rhomb shapes of the white rhombic sub-pixels (W) are arranged in the column direction, while the major axes of rhomb shapes of the blue rhombic sub-pixels (B) and the major axes of rhomb shapes of the green rhombic sub-pixels (G) are respectively rotated by 120° or 60° clockwise and counterclockwise, with respect to the column direction.

7. The display panel of claim 1, wherein the display panel comprises the RGB pixel units and the RGW pixel units arranged adjacent to each other, and the preset direction is the row direction; wherein,
in the RGB pixel units, the major axes of rhomb shapes of the blue rhombic sub-pixels (B) are arranged in the row direction, while the major axes of rhomb shapes of the red rhombic sub-pixels (R) and the major axes of rhombs of the green rhombic sub-pixels (G) are respectively rotated by 120° or 60° clockwise and counterclockwise, with respect to the row direction; and
in the RGW pixel units, the major axes of rhomb shapes of the white rhombic sub-pixels (W) are arranged in the row direction, while the major axes of rhomb shapes of the red rhombic sub-pixels (R) and the major axes of rhomb shapes of the green rhombic sub-pixels (G) are respectively rotated by 120° or 60° clockwise and counterclockwise, with respect to the row direction.

8. The display panel of claim 1, wherein the display panel comprises the RGB pixel units and the RBW pixel units arranged adjacent to each other, and the preset direction is the row direction; wherein,
in the RGB pixel units, the major axes of rhomb shapes of the green rhombic sub-pixels (G) are arranged in the row direction, while the major axes of rhomb shapes of the red rhombic sub-pixels (R) and the major axes of rhomb shapes of the blue rhombic sub-pixels (B) are respectively rotated by 120° or 60° clockwise and counterclockwise, with respect to the row direction; and
in the RBW pixel units, the major axes of rhomb shapes of the white rhombic sub-pixels (W) are arranged in the row direction, while the major axes of rhomb shapes of the red rhombic sub-pixels (R) and the major axes of rhomb shapes of the blue rhombic sub-pixels (B) are respectively rotated by 120° or 60° clockwise and counterclockwise, with respect to the row direction.

9. The display panel of claim 1, wherein the display panel comprises the RGB pixel units and the BGW pixel units, and the preset direction is the row direction; wherein,
in the RGB pixel units, the major axes of rhomb shapes of the red rhombic sub-pixels (R) are arranged in the row direction, while the major axes of rhomb shapes of the blue rhombic sub-pixels (B) and the major axes of rhomb shapes of the green rhombic sub-pixels (G) are respectively rotated by 120° or 60° clockwise and counterclockwise, with respect to the row direction; and
in the BGW pixel units, the major axes of rhomb shapes of the white rhombic sub-pixels (W) are arranged in the row direction, while the major axes of rhomb shapes of the blue rhombic sub-pixels (B) and the major axes of rhomb shapes of the green rhombic sub-pixels (G) are respectively rotated by 120° or 60° clockwise and counterclockwise, with respect to the row direction.

10. A display device, wherein the display device comprises the display panel of claim 1.

11. A display method for a display panel, wherein the display panel comprises the display panel of claim 1, the display method comprising:
jointing sub-pixels, having one color, of the pixel units adjacent to each other, to form a polygon shape as a sampling area for the corresponding color, such that the sub-pixels having different colors form sampling areas for different colors, respectively;
wherein, when one color is to be displayed within the corresponding sampling area, the sub-pixels within the corresponding sampling area are lighted for displaying the color.

12. The display method of claim 11, wherein, and, if a multicolor is to be displayed in a preset position of the display panel, sampling areas made up of red rhombic sub-pixels (R), sampling areas made up of green rhombic sub-pixels (G) and sampling areas made up of blue rhombic sub-pixels (B), around the preset position, perform output independently and respectively; and
if a brightness is to be increased in a preset position of the display panel, sampling areas made up of white rhombic sub-pixels (W) around the preset position perform output.

13. The display method of claim 11, wherein:
in the XYW pixel units, white rhombic sub-pixels (W) are arranged such that their major axes of rhomb shapes are arranged in the preset direction;
in the RGB pixel units, any one of the red rhombic sub-pixels (R), the blue rhombic sub-pixels (B) and the green rhombic sub-pixels (G) is arranged such that its major axis of rhomb shape is arranged in the preset direction;
in the display panel, the rhombic sub-pixels, having one color, of each of the pixel units are not arranged adjacent to the rhombic sub-pixels, having the same color, of their adjacent ones of the pixel units, if a first color, which corresponds to one of the two rhombic sub-pixels other than the rhombic sub-pixels of which the major axes of rhomb shapes are arranged in the preset direction, is to be displayed in a preset position of the display panel,
wherein the display method comprises:
lighting, three adjacent sub-pixels for the first color, which are arranged around the present position in a triangular arrangement to constitute a triangular sampling area for the first color, for displaying the first color; or
lighting, four adjacent sub-pixels for the first color, which are arranged around the present position in a rhombic arrangement to constitute a rhombic sampling area for the first color, for displaying the first color.

14. The display method of claim 13, wherein the first color is red or green, and the second color is blue or white.

15. The display method of claim 13, wherein if the first color is to be displayed continuously in the display panel, the display method comprises:
lighting, sub-pixels for the first color within a plurality of continuous rhombic sampling areas achieved by dividing a display region by rhomb shapes each formed by connecting the sub-pixels for the first color, for continuously displaying the first color.

16. The display method of claim 15, wherein if a second color, which corresponds to the rhombic sub-pixels of which the major axes of rhomb shapes are arranged in the preset direction, is to be displayed in a preset position of the display panel, the display method comprises:
lighting, at least one sub-pixel for the second color, which are arranged around the present position and are adjacent to each other to constitute a rectangular sampling area for the second color, for displaying the second color.

17. The display method of claim 16, wherein if the second color is to be displayed continuously in the display panel, the display method comprises:

lighting, sub-pixels for the first color within a plurality of continuous rhombic sampling areas achieved by dividing a display region by rectangular shapes each comprising the sub-pixels for the second color, for continuous displaying the color.

* * * * *